United States Patent [19]

Nose

[11] Patent Number: 4,987,605
[45] Date of Patent: Jan. 22, 1991

[54] RADIO RECEIVER INCORPORATING AUTOMATIC MEANS FOR SETTING BROADCAST STANDARD

[75] Inventor: Tetsuya Nose, Iwaki, Japan

[73] Assignee: Alpine Electronics Inc., Tokyo, Japan

[21] Appl. No.: 379,410

[22] Filed: Jul. 12, 1989

[30] Foreign Application Priority Data

Jul. 13, 1988 [JP] Japan .................. 63-174184

[51] Int. Cl.⁵ .................. H04B 11/16; H04B 1/16
[52] U.S. Cl. .................. 455/161; 455/180; 455/186; 455/188; 455/343
[58] Field of Search .......... 455/165, 168, 179, 180, 455/188, 190, 183, 186, 161

[56] References Cited

U.S. PATENT DOCUMENTS 4,048,570  9/1977  Sumi ...................... 455/188
4,303,944 12/1981  Kitamura ................ 455/188

Primary Examiner—Reinhard J. Eisenzopf
Assistant Examiner—Curtis Kuntz
Attorney, Agent, or Firm—Guy W. Shoup; Paul J. Winters

[57] ABSTRACT

A worldwide radio receiver capable of receiving broadcastings corresponding to a plurality of destinations, characterized in that one of the destinations is determined according to a frequency step and/or a band range where a broadcasting station in the destination is present upon supplying a power to the radio receiver, and that a receving standard corresponding to the destination determined above is set to operate a tuner unit built in the radio receiver.

8 Claims, 4 Drawing Sheets

RADIO RECEIVER INCORPORATING AUTOMATIC MEANS FOR SETTING BROADCAST STANDARD

BACKGROUND OF THE INVENTION

The present invention relates to a worldwide radio receiver capable of selecting a receiving standard in accordance with one of plural destinations in the world, and more particularly to a worldwide radio receiver capable of automatically setting the receiving standard.

An electronic tuning type radio receiver is used in various regions of the world owing to its high accuracy and ease of tuning. However, as receiving standards such as frequency band, channel step, modulation degree, de-emphasis, etc. are different depending on the various regions, a radio receiver maker has manufactured and sold various radio receivers in correspondence with broadcasting standards in the various regions as destinations such as U.S.A., Germany, Europe, Oceania, Southeast Asia, Middle and Near East, South Africa, Japan, etc. The radio receiver itself is so constructed as to adapt the receiving standards to correspond to the broadcasting standards in the various regions of the world, and the correspondence between the receiving standards and the broadcasting standards is set by setting a region code with a pin in correspondence with the destination.

Thus, the receiving standard in the conventional radio receiver is set in correspondence with the broadcasting standard in the region identified by the region code set and locked by the pin (the region code cannot be freely set by a user). Accordingly, although the radio receiver can receive a given broadcasting in the destination, it cannot receive broadcastings in other regions.

SUMMARY OF THE INVENTION

It is an object of the present invention to provide a worldwide radio receiver which may automatically select a receiving standard in accordance with one of plural destinations in the world and allows a user to receive desired broadcasting in the destination.

According to the present invention, there is provided a worldwide radio receiver capable of receiving broadcastings corresponding to a plurality of destinations, characterized in that one of said destinations is determined according to a frequency step and/or a band range where a broadcasting station in said destination is present upon supplying a power to said radio receiver, and that a receiving standard corresponding to said destination determined above is set to operate a tuner unit built in said radio receiver.

When an electric power is supplied to the radio receiver, a control unit in the radio receiver operates to search a broadcasting station receivable in the destination and determine the destination according to the frequency step and the band range to be received from the broadcasting station. Then, the control unit sets a receiving standard (frequency step, band range, de-emphasis characteristic, audio level, etc.) corresponding to the destination determined above and operates the tuner unit in accordance with the receiving standard set above.

In order to more ensure the determination of the destination, a broadcasting system being adopted in a specific region such as RDS (Europe) and AM stereo broadcasting (U.S.A. and Australia) may be added to the frequency step and the band range as the criteria of the determination.

Other objects and features of the invention will be more fully understood from the following detailed description and appended claims when taken with the accompanying drawings.

DETAILED DESCRIPTION OF THE PREFERRED EMBODIMENTS

Figure 1:
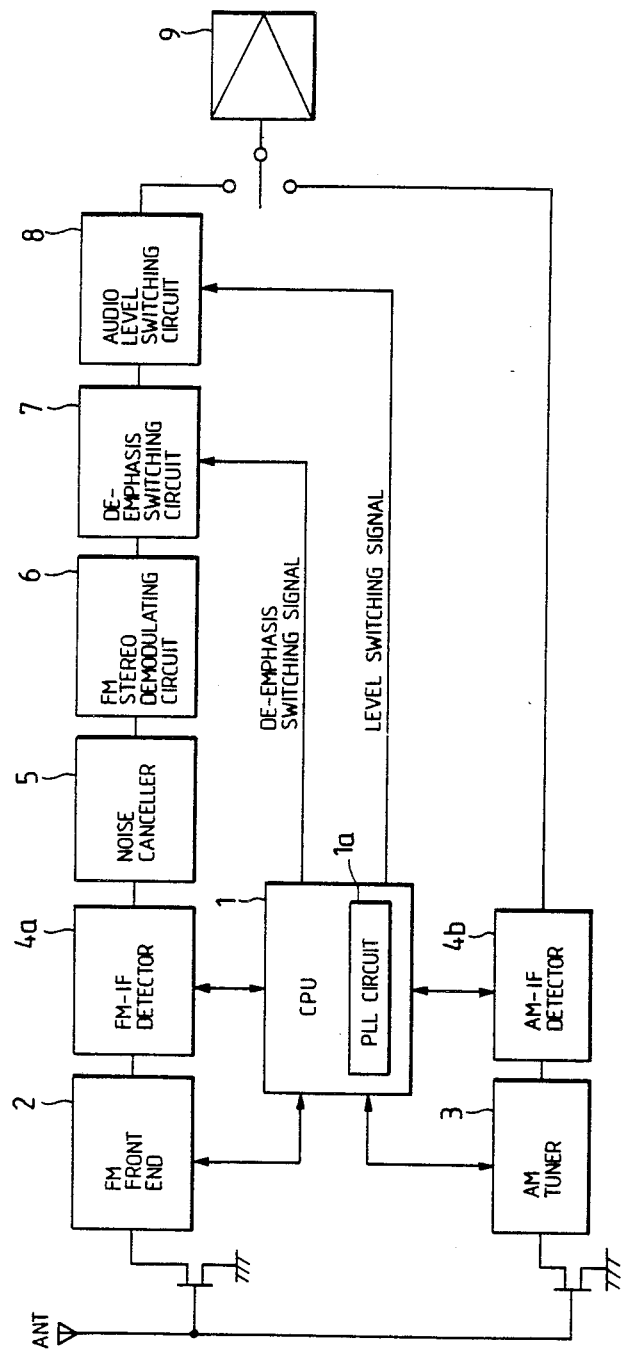
FIG. 1 is a block diagram of an essential part of the radio receiver according to a first preferred embodiment of the present invention.

Referring to FIG. 1 which shows a block diagram of the essential part of the radio receiver according to a first preferred embodiment of the present invention, reference numeral 1 designates a control unit (CPU) for controlling the radio receiver. The CPU 1 includes a PLL circuit 1a for generating a frequency control signal to control the tuning operation of an FM front end 2 and an AM tuner 3 which are of an electronic tuning type. The FM front end 2 and the AM tuner 3 are provided with receiving bands corresponding to FM/AM broadcasting standards in the world. Some typical examples of the FM/AM broadcasting standards will be shown in Table 1.

TABLE 1

| Destination | Band | Band Range | Frequency Step |
|---|---|---|---|
| Japan | MW | 522–1629 kHz | 9 kHz |
|  | FM | 76.0–90.0 MHz | 100 kHz |
| U.S.A. | MW | 530–1610 kHz | 10 kHz |
|  | FM | 87.0–107.9 MHz | 200 kHz |
| Europe | MW | 522–1611 kHz | 9 kHz |
|  | FM | 87.5–108.0 MHz | 50 kHz |
|  | LW | 153–290 kHz | 1 kHz |

In the case that the destination is Japan, the AM tuner 3 conducts the tuning operation (up/down seek) at the frequency step of 9 kHz in the band range of MW 522–1629 kHz, and the FM front end 2 conducts the tuning operation at the frequency step of 100 kHz in the band range of FM 76.0–90.0 MHz.

An FM-IF detector 4a and an AM-IF detector 4b are provided to conducts FM detection and AM detection with respect to intermediate frequency signals (IF) to be output from the FM front end 2 and the AM tuner 3, respectively. A noise canceller 5 is provided to remove a pilot signal and a pulse signal contained in a detection output from the FM-IF detector 4a. An FM stereo demodulating circuit 6 is provided to reproduce an L-channel signal and an R-channel signal with use of an input stereo composite signal and generate the L- and R-channel signals.

Figure 2:
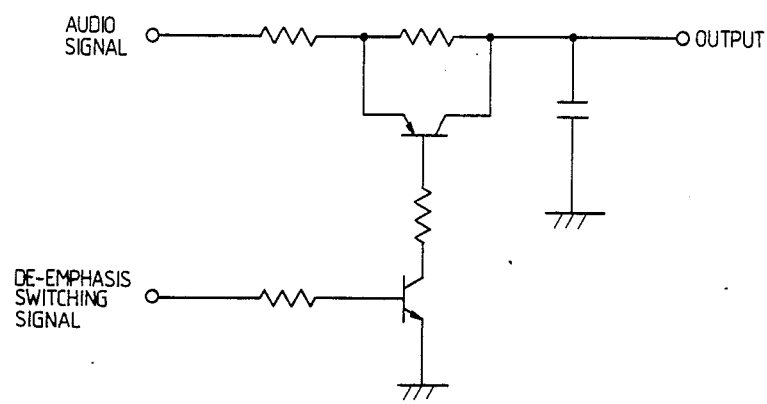
FIG. 2 is a circuit diagram of a de-emphasis switching circuit shown in FIG. 1.

A de-emphasis switching circuit 7 is provided to attenuate a high-frequency region emphasized by a broadcasting station and correct a frequency characteristic to a flat characteristic. FIG. 2 shows an example of the de-emphasis switching circuit, wherein two kinds of de-emphasis characteristics are switched. The de-emphasis characteristic may be variably set by the de-emphasis switching circuit 7. For example, a time constant of 50 μsec for Japan, a time constant of 75 μsec for U.S.A., and a time constant of 50 μsec for Europe (inclusive of Australia) may be variably set.

Figure 3:
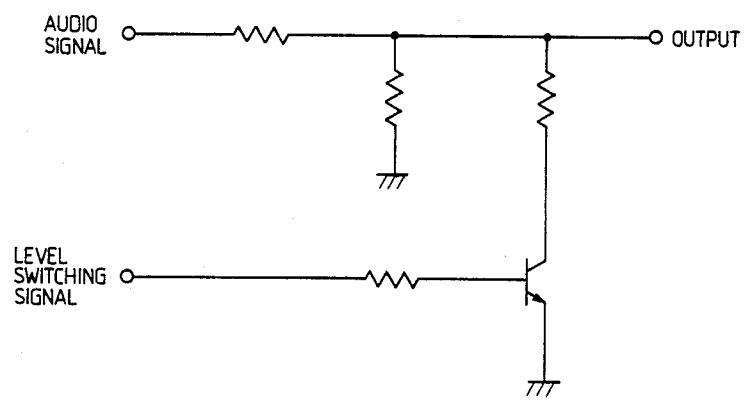
FIG. 3 is a circuit diagram showing the principle of audio level switching in an audio level switching circuit shown in FIG. 1.

An audio level switching circuit 8 is provided to unify different audio levels depending on the destinations to a reference level. FIG. 3 shows a principle of audio level switching in the audio level switching circuit. An audio signal input from the de-emphasis switching circuit 7 is adjusted to a predetermined level according to a level switching signal input from the CPU 1 as shown in Table 2.

TABLE 2

| Destination | Audio Level (dB) | | | |
|---|---|---|---|---|
| | FM | AM | TAPE | CD |
| Japan | 0 | −10 | −3 | +5 |
| U.S.A. | 0 | −8 | 0 | +8 |
| Europe (inclusive of Australia) | 0 | 0 | 0 | +8 |

In Japan, for example, as the destination, the audio level is adjusted to 0 dB for FM at a modulation degree of 75 kHz, −10 dB for AM at a modulation degree of 30%, −3 dB for tape deck and +5 dB for CD.

A low-frequency amplifier 9 is provided to amplify the audio signal of FM or AM. The audio signal amplified is output from a speaker (not shown).

When an electric power is supplied to the radio receiver, the CPU 1 operates to search a broadcasting station receivable in the destination and determine the destination according to a frequency step and a band range to be received from the broadcasting station. Then, the CPU 1 sets a receiving standard (frequency step, band range, de-emphasis characteristic, audio level, etc.) corresponding to the destination determined above and operates the electronic tuner unit including the FM front end 2 and the AM tuner 3 in accordance with the receiving standard set above.

The operation of the preferred embodiment will now be described with reference to the flow chart shown in FIG. 4. In this preferred embodiment, the radio receiver is shipped to Japan, U.S.A., Europe and Australia only.

Figure 4:
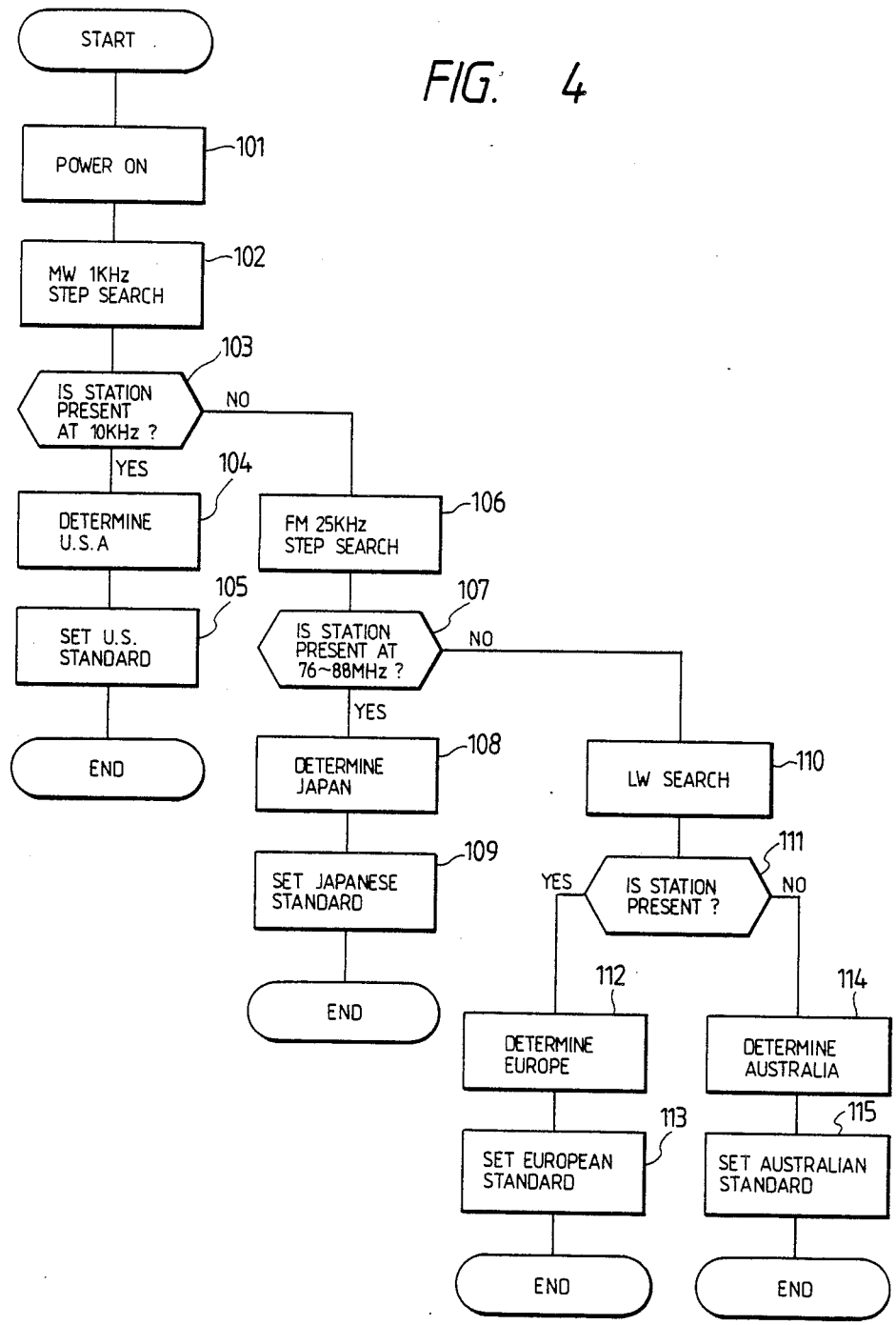
FIG. 4 is a flow chart of the operation of the present invention.

Referring to FIG. 4, when the power is input (step 101), the CPU 1 controls the PLL circuit 1a to search an AM broadcasting station with the AM tuner 3 at a frequency step of 1 kHz in a band range of 530-1629 kHz (step 102).

If the AM broadcasting station is present at the frequency step of 10 kHz rather than the frequency step of 9 kHz (step 103), the CPU 1 determines that the destination is U.S.A. (step 104) and sets the receiving standard corresponding to the U.S. standard as shown in Tables 1 and 2 so as to operate the electronic tuner unit (step 105). Then, the program is ended.

In step 103, if the AM broadcasting station is present at the frequency step of 9 kHz rather than the frequency step of 10 kHz, the CPU 1 controls the PLL circuit 1a to search an FM broadcasting station with the FM front end 2 at a frequency step of 25 kHz in a band range of 76.0-108.0 MHz (step 106).

If the FM broadcasting station is present in the band range of 76.0-88.0 MHz (step 107), the CPU 1 determines that the destination is Japan (step 108) and sets the receiving standard corresponding to a Japanese standard as shown in Tables 1 and 2 so as to operate the electronic tuner unit (step 109). Then, the program is ended.

In step 107, if the FM broadcasting station is not present in the band range of 76.0-88.0 MHz, the CPU 1 searches a broadcasting station in an LW band of 153-290 kHz (step 110).

If the broadcasting station is present in the band range of 153-290 kHz (step 111), the CPU 1 determines that the destination is Europe (step 112) and sets the receiving standard to a European standard as shown in Tables 1 and 2 so as to operate the electronic tuner unit (step 113). Then, the program is ended.

In step 111, if the broadcasting station is not present in the band range of 153-290 kHz, the CPU 1 determines that the destination is Australia (step 114) and sets the receiving standard to an Australian standard as shown in Tables 1 and 2 so as to operate the electronic tuner unit (step 115). Then, the program is ended.

Figure 5:
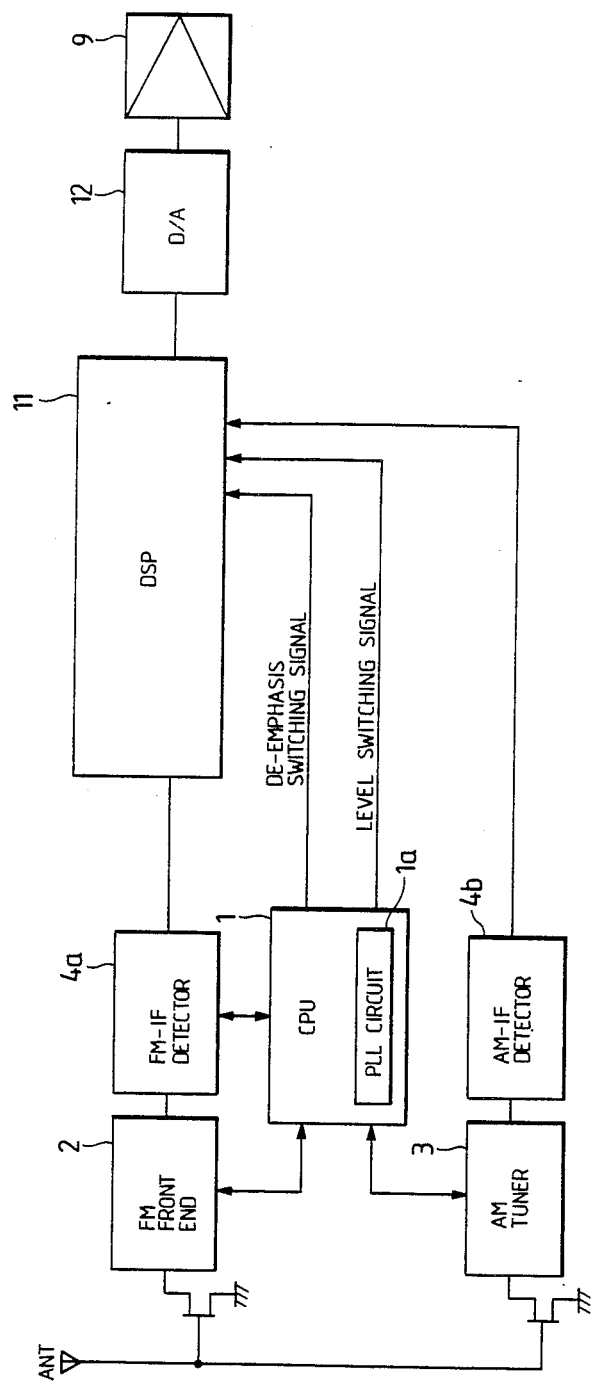
FIG. 5 is a block diagram of a second preferred embodiment according to the present invention.

Referring next to FIG. 5 which shows a second preferred embodiment of the present invention, reference numeral 11 designates a DSP (digital signal processor) for converting FM/AM signals to digital signals and digitally processing the signals, and reference numeral 12 designates a D/A converter for converting the digital FM/AM signals output from the DSP 11 to analog signals. The same reference numerals as in FIG. 1 designate the same or corresponding elements.

In the second preferred embodiment, after the destination is determined, the signal processing is digitally executed by the DSP 11 instead of the de-emphasis switching circuit 7 and the audio level switching circuit 8 as shown in FIG. 1. Further, adjustment of the audio level or the like with respect to an AM signal can be established.

In addition to the frequency step and the band range, the following broadcasting system may be employed in determining the destination so as to more ensure the determination.

RDS ... multiplex broadcasting system being adopted in Europe

AM stereo broadcasting ... broadcasting system being adopted in U.S.A. and Australia Further, the receiving standard once set may be locked by storing same in a backup memory or the like as far as new instruction is not entered.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A radio receiver, being operable by means of a power supply switching means, for receiving broadcast signals, said broadcast signals conforming to broadcast standards set by individual countries, said radio receiver comprising:

means for automatically detecting one of plurality of broadcast standards and controlling said radio receiver to receive broadcast signals conforming to a detected broadcast standard, said means for detecting and controlling comprising:

means activated automatically upon power being applied to said radio receiver via said power supply switching means for automatically searching a plurality of broadcast bands, said means for automatically searching using predetermined frequency steps to automatically search a first broadcast band to detect whether said first broadcast band conforms to one of said plurality of broadcast standards.

2. The radio receiver of claim 1 wherein said means for automatically searching a plurality of broadcast bands determines said one of said plurality of broadcast standards by additionally detecting broadcast signals within a range of frequencies which identify said one of said plurality of broadcast standards.

3. The radio receiver of claim 1 wherein said means for automatically searching a plurality of broadcast bands comprises a central processor unit which automatically searches broadcast signals within a predetermined broadcast band and determines broadcast standards to which said broadcast signals conforms by detecting frequency steps and a frequency range of said broadcast signals within said broadcast band.

4. The radio receiver of claim 3 wherein said central processing unit, upon detection of a particular broadcast standard, sets within said radio receiver a receiving standard including frequency step, frequency band range, de-emphasis characteristics, and audio level associated with said broadcasting standard.

5. The radio receiver of claim 1 wherein said means for automatically searching a plurality of broadcast bands comprises a means for automatically selecting a broadcast band and searching said broadcast band using predetermined frequency steps, and for detecting whether broadcast signals within said broadcast band coincide with frequency steps associated with a certain broadcast standard, and in response to such detection, controlling circuitry within said radio receiver to receive broadcast signals conforming to said detected broadcast standard.

6. The radio receiver of claim 5 wherein said means for automatically searching a plurality of broadcast bands first selects an AM broadcast band frequency range and detects a broadcast standard for said AM broadcast band using said predetermined frequency steps, and, if said AM broadcast band is not sufficient to identify broadcast standards for all bands capable of being received by said radio receiver, said means for automatically searching searches a second broadcast band.

7. The radio receiver of claim 5 wherein said means for automatically searching a plurality of broadcast bands sets all broadcast bands capable of being received by said radio receiver to predetermined broadcast standards upon detecting a broadcast standard associated with a particular country.

8. The radio receiver of claim 7 further comprising memory means for storing a broadcast standard once set within said radio receiver by said means for automatically searching.

* * * * *